(12) United States Patent
Mae (10) Patent No.: US 7,202,588 B2
(45) Date of Patent: Apr. 10, 2007

(54) CHASSIS FRAME BUCKLING CONTROL DEVICE AND CHASSIS FRAME DEFORMATION CONTROL DEVICE

(75) Inventor: Hiroyuki Mae, Shioya-gun (JP)

(73) Assignee: Honda Motor Co., Ltd., Tokyo (JP)

( * ) Notice: Subject to any disclaimer, the term of this patent is extended or adjusted under 35 U.S.C. 154(b) by 0 days.

(21) Appl. No.: 11/000,257

(22) Filed: Nov. 30, 2004

(65) Prior Publication Data
US 2005/0121997 A1 Jun. 9, 2005

(30) Foreign Application Priority Data
Dec. 3, 2003 (JP) ............................. 2003-404377
Dec. 3, 2003 (JP) ............................. 2003-404378

(51) Int. Cl.
*H02N 2/04* (2006.01)
(52) U.S. Cl. .............. 310/311; 310/323.01; 310/323.18
(58) Field of Classification Search ................ 310/311, 310/323.01, 323.18
See application file for complete search history.

(56) References Cited

U.S. PATENT DOCUMENTS

| 6,193,303 | B1 * | 2/2001 | Urushiyama et al. .. 296/187.03 |
| 6,286,895 | B1 * | 9/2001 | Urushiyama et al. .. 296/187.03 |
| 6,580,385 | B1 * | 6/2003 | Winner et al. ................ 342/70 |
| 6,962,229 | B2 * | 11/2005 | Miyahara .................... 180/291 |
| 2002/0175591 | A1 * | 11/2002 | Schreiner et al. ........... 310/311 |

FOREIGN PATENT DOCUMENTS

JP 07-165110 6/1995

* cited by examiner

*Primary Examiner*—Darren Schuberg
*Assistant Examiner*—Derek Rosenau
(74) *Attorney, Agent, or Firm*—Hamre, Schumann, Mueller & Larson, PC (57) ABSTRACT

The present invention is including: a piezoelectric element actuator provided on a chassis frame and capable of generating a load along the chassis frame; and, a control unit that controls the load of the piezoelectric element actuator.

3 Claims, 9 Drawing Sheets

CHASSIS FRAME BUCKLING CONTROL DEVICE AND CHASSIS FRAME DEFORMATION CONTROL DEVICE

BACKGROUND OF THE INVENTION

1. Field of the Invention

The present invention relates to a chassis frame buckling control device and a chassis frame deformation control device that control collapse buckling and deformation of a chassis frame that occur during an impact.

The present application claims priority on Japanese Patent Application No. 2003-404377 filed on Dec. 3, 2003, and Japanese Patent Application No. 2003-404378 filed on Dec. 3, 2003, the contents of which are incorporated herein by reference.

2. Description of the Related Art

Technology has been disclosed wherein, by providing an indentation referred to as a bead in the leading edge of a front frame that is a member of a chassis, buckling is controlled so that the front frame buckles starting from the indentation in the case a compressive load is applied to the front frame (refer to, for example, Japanese Unexamined Patent Application, First Publication No. H07-165110).

As was previously stated, in the case of passive buckling control in which an indentation is provided in a chassis frame, since the buckling starting load and other deformation load characteristics have only one specification, there was the problem of the chassis frame being unable to be made to properly buckle or deform at all times with respect to a plurality of different types of impacts.

Thus, an object of the present invention is to provide a chassis frame buckling control device and a chassis frame deformation control device capable of causing a chassis frame to properly buckle or deform at all times with respect to a plurality of different types of impacts.

SUMMARY OF THE INVENTION

In order to solve the aforementioned problems, the present invention provides a chassis frame buckling control device including: a piezoelectric element actuator provided on a chassis frame and capable of generating a load along the chassis frame; and a control unit that controls the load of the piezoelectric element actuator.

According to the chassis frame buckling control device, when a load in the direction of elongation is generated in the piezoelectric element actuator by the control of the control unit, the rigidity of the section of the frame where this piezoelectric element actuator is arranged increases as a result of the piezoelectric element actuator stretching, thereby resulting in greater resistance to buckling. Conversely, when a load in the direction of contraction is generated in the piezoelectric element actuator or when a load is not generated in the piezoelectric element actuator, the rigidity of the section of the frame where this piezoelectric element actuator is arranged decreases, thereby being able to promote buckling. Thus, the chassis frame can be made to buckle properly at all times with respect to a plurality of different types of impacts such as types of impacts in which resistance to buckling is preferable or types of impacts in which promotion of buckling is preferable.

The piezoelectric element actuator may be provided in the vicinity of a weak section of the chassis frame.

In this case, since the piezoelectric element actuator is provided in the vicinity of a weak section of the chassis frame, when a load in the direction of elongation is generated in the piezoelectric element actuator by the control of the control unit, the rigidity of the section of the chassis frame where the piezoelectric element actuator is arranged increases as a result of the piezoelectric element actuator stretching, thereby making it possible to increase the resistance to buckling even if there is a weak section nearby. Conversely, when a load in the direction of contraction is generated in the piezoelectric element actuator or a load is not generated in the piezoelectric element actuator, the rigidity of the section of the chassis frame where the piezoelectric element actuator is arranged decreases, thereby making it possible to promote buckling starting from the weak section nearby.

Thus, the chassis frame can be reliably made to buckle properly at all times with respect to a plurality of different types of impacts such as types of impacts in which resistance to buckling is preferable or types of impacts in which promotion of buckling is preferable.

Moreover, the present invention provides a chassis frame deformation control device including: a piezoelectric element actuator provided on the inside corner of a bent section of a chassis frame containing the bent section and capable of generating a load along the chassis frame; and a control unit that controls the load of the piezoelectric element actuator.

In this case, when a load in the direction of elongation is generated in the piezoelectric element actuator provided on the inside corner of the bent section by the control of the control device during an impact, the chassis frame can be made to collapse and buckle by inhibiting the occurrence of breakage in the bent section as a result of the piezoelectric element actuator stretching. Conversely, breakage is allowed to occur in the bent section unless, for example, a load is generated in the piezoelectric element actuator at the time of an impact. Thus, the chassis frame can be made to properly deform at all times with respect to a plurality of different types of impacts such as types of impacts in which the occurrence of buckling is preferable or types of impacts in which the occurrence of breakage is preferable.

The chassis frame deformation control device may also be provided with a detection unit capable of detecting the location of the chassis frame where buckling progresses, and the control unit may control the load of the piezoelectric element actuator based on the detection results of the detection unit.

In this case, since the location of the chassis frame where buckling progresses can be detected with the detection unit, and the generation of the load in the piezoelectric element actuator can be controlled corresponding to the detection results, namely the location where buckling progresses, deformation of the chassis frame can be controlled more precisely. For example, buckling can be made to occur farther towards the rear from the bent section by generating a load in the direction of elongation in the piezoelectric element actuator during an impact causing it to stretch, allowing that buckling to reach the bent section, and discontinuing stretching by removing the load of the piezoelectric element actuator when buckling reaches the bent section. In other words, in cases when collapse and buckling are desired, the chassis frame can be made to collapse and buckle reliably even if there are bent sections.

DETAILED DESCRIPTION OF THE PREFERRED EMBODIMENTS

First Embodiment

The following provides an explanation of a chassis frame buckling control device of a first embodiment of the present invention with reference to the drawings.

Figure 1:
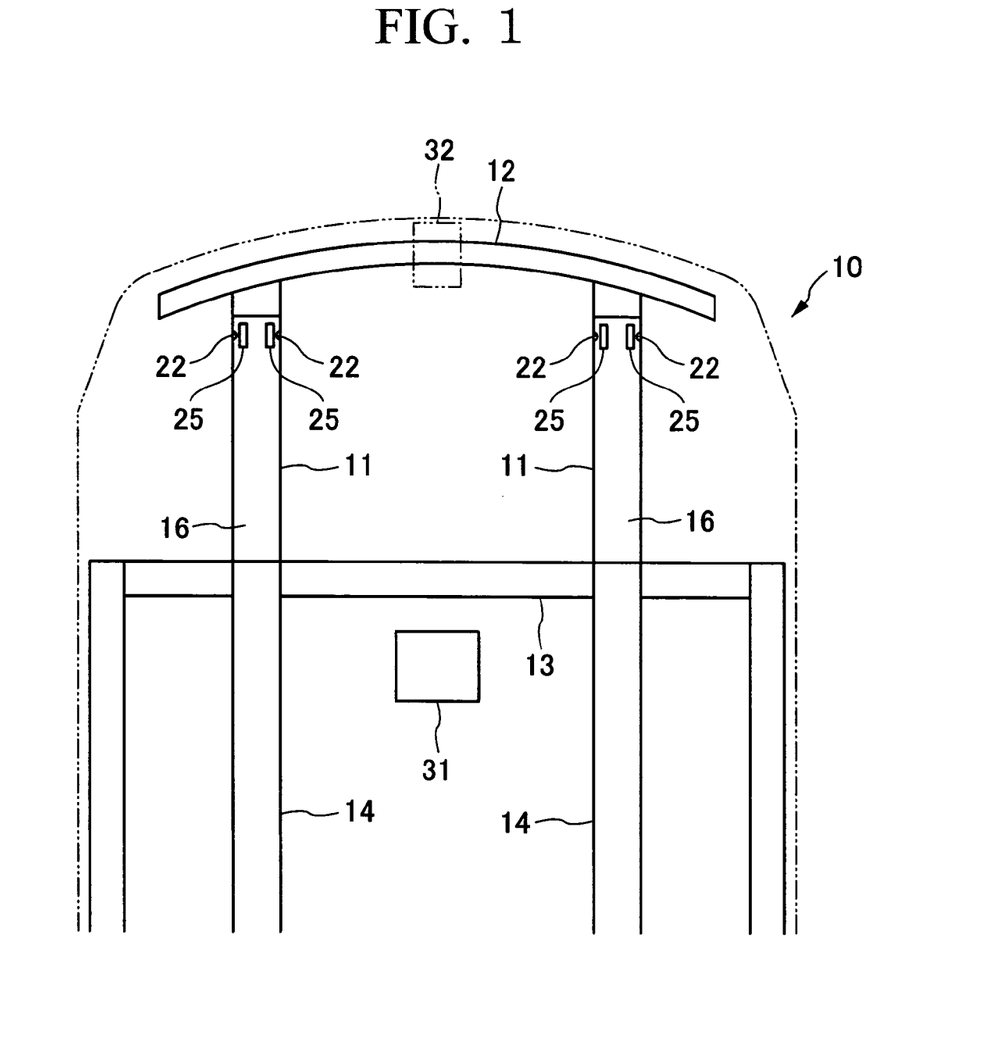
FIG. 1 is an overhead view schematically showing the front section of a vehicle chassis to which a chassis frame buckling control device of a first embodiment of the present invention is applied.

FIG. 1 shows the front section of a chassis of a vehicle 10. In the front section of chassis, a pair of front side frames (chassis frames) 11, which are chassis frame members, are provided separated in the direction of vehicle width in the state of running in the longitudinal direction of the chassis. The distal ends of the front side frames 11 are respectively coupled to a front bumper beam 12 that extends in the direction of vehicle width. The proximal ends of the front side frames 11 respectively intersect with a dashboard lower cross member 13 extending in the direction of vehicle width, and are coupled to floor frames 14 that extend in the longitudinal direction of the chassis.

Figure 2:
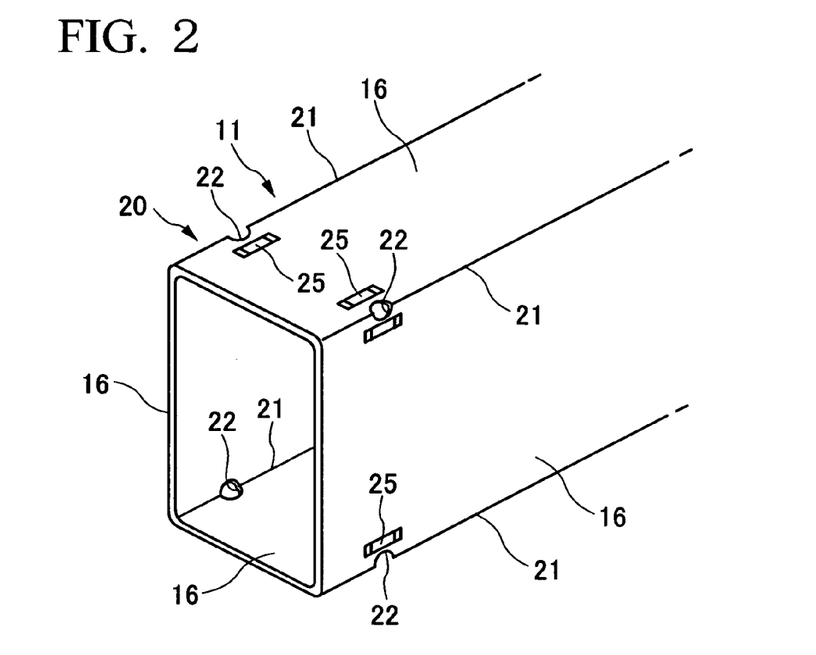
FIG. 2 is a perspective view showing a front side frame to which a chassis frame buckling control device of the first embodiment of the present invention is applied.

The front side frames 11 are made of a steel material, and as schematically shown in FIG. 2, four plate sections 16 are coupled in the shape of a frame, and the cross-section that is perpendicular to the direction of length is in the form of a nearly rectangular, closed cross-section.

A chassis frame buckling control device 20 of the present embodiment controls buckling of the front side frames 11.

Figure 3:
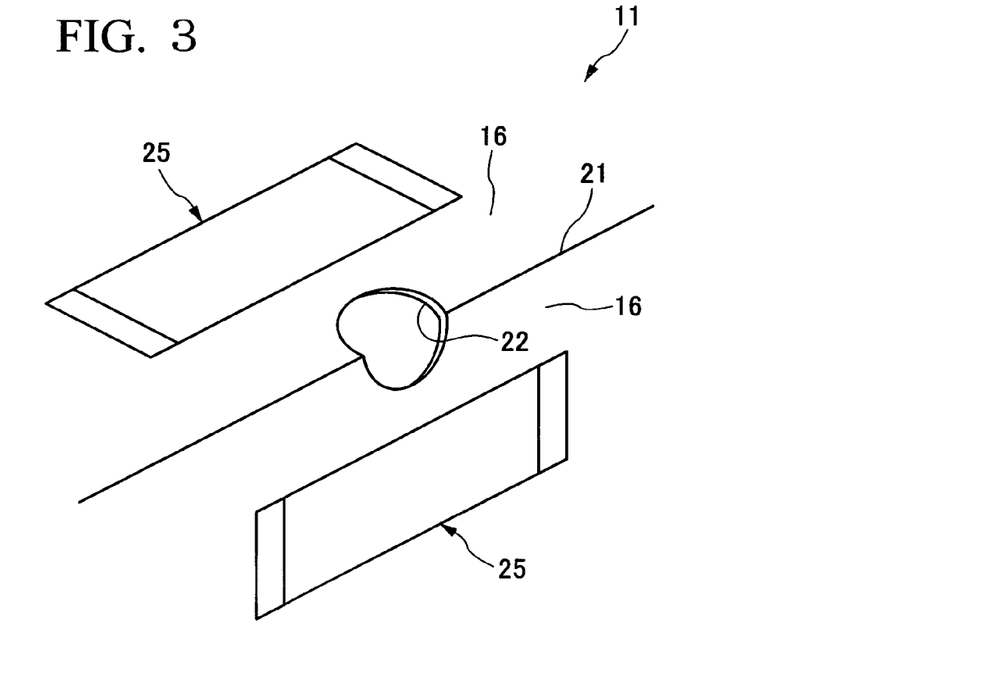
FIG. 3 is a partially enlarged perspective view of a front side frame to which a chassis frame buckling control device of the first embodiment of the present invention is applied.

As is also shown in FIG. 3, holes (weak sections) 22 are formed in the distal end of each front side frame 11 (front end side in the longitudinal direction of the chassis, load input side during an impact) at corner sections 21 between adjacent the plate sections 16. The purpose of these holes 22 is to promote the occurrence of buckling when the load is input from the front and weakening the front side frame 11 partially. The holes 22 are formed all four corner sections 21, and their locations in the direction of extension of the front side frame 11 nearly coincide. Furthermore, since the holes 22 are only required to be weaker than the surrounding material, concave-shaped bead weakened sections 22, for example, may also be used instead of the holes 22.

In the chassis frame buckling control device 20 of the present embodiment, a piezoelectric element actuator 25 capable of generating a load along the direction of extension of the front side frame 11 is provided on each front side frame 11.

Specifically, the rectangular piezoelectric element actuators 25 are provided at locations near each hole 22 on both sides on all plate sections 16 of the front side frame 11. In other words, these piezoelectric element actuators 25 are provided on the distal end (load input side during an impact) of the front side frame 11. Each piezoelectric element actuator 25 is able to generate a load in the direction of length. The direction of length of each piezoelectric element actuator 25 is coinciding with the direction of extension of the front side frame 11, namely the longitudinal direction of the chassis. These piezoelectric element actuators 25 are arranged to be larger longitudinally than the length of each hole 22 along the direction of extension of the front side frame 11, with their locations in the direction of extension of the front side frame 11 nearly coinciding.

Figure 4A:
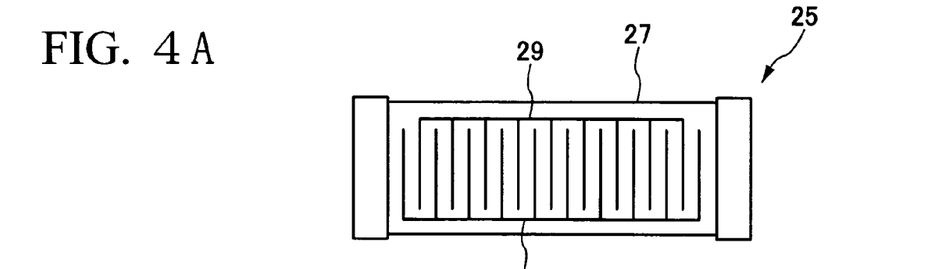
FIG. 4A and FIG. 4B are drawings showing a piezoelectric element actuator in a chassis frame buckling control device of the first embodiment of the present invention, with FIG. 4A being an overhead view and FIG. 4B being a side view.
Figure 4B:
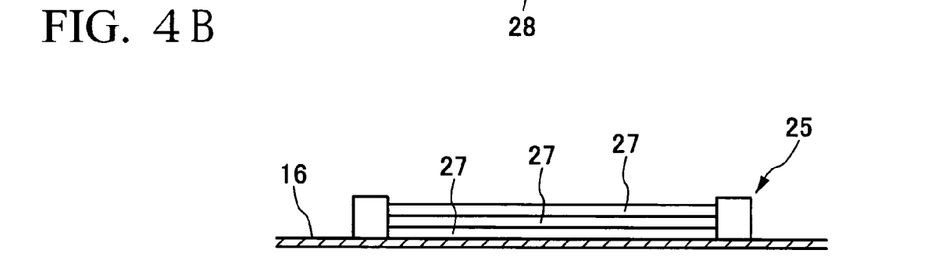

As shown in FIG. 4A and FIG. 4B, each piezoelectric element actuator 25 is composed of a plurality of piezoelectric elements 27 of the same shape being layered in the direction of thickness in the state in which their orientations are aligned. Each piezoelectric element 27 is provided with electrodes 28, 29 each having a comb-like shape aligned reciprocally. Each piezoelectric element 27 generates a load in the elongating direction in the direction of length when a voltage is applied using the electrode 28 as a positive electrode and the other electrode 29 as a negative electrode. Conversely, each piezoelectric element 27 generates a load in the contracting direction in the direction of length when a voltage is applied using the electrode 28 as a negative electrode and the other electrode 29 as a positive electrode.

All of these piezoelectric element actuators 25 are connected to a controller (control unit) 31 shown in FIG. 1, and the voltage applied to electrodes 28 and 29, namely the load of the piezoelectric element actuators 25, is controlled by this controller 31. The controller 31 is connected to a radar 32 that detects an obstacle in front of the chassis, for example.

The controller 31 predicts the possibility of an impact with a forward obstacle based on detection data of the radar 32, and when an impact is predicted to be present, it further predicts the impact speed, impact angle and so forth. In addition, the controller 31 is also able to determine the operation of the piezoelectric element actuators 25 by assessing the type of impact according to a piezoelectric film sensor installed on the bumper face and so forth. In the case in which the controller 31 has judged the impact speed to be greater than a predetermined speed, the controller 31 applies voltage to all the piezoelectric element actuators 25 so that a load is generated in the direction of elongation. Whereupon, the commencement of buckling from the holes 22 formed in the distal ends of the front side frames 11 can be delayed as a result of stretching by the piezoelectric element actuators 25 provided according to the locations of the holes 22 along the direction of load input, thereby increasing the buckling starting load of the distal ends of the front side frames 11. As a result, the degree of deceleration during the occurrence of an impact is increased, and airbags and other impact safety devices, for example, can be activated earlier.

On the other hand, in the case the controller 31 has judged the impact speed to be lower than a predetermined speed, the controller 31 applies a voltage to all piezoelectric element actuators 25 so that a load is generated in the direction of contraction. Whereupon, since buckling can be promoted by enabling buckling to start easily from the holes 22 formed in the distal ends of the front side frames 11, the buckling starting load of the distal ends of the front side frames 11 can be reduced. As a result, repair costs can be reduced by, for example, limiting the site of energy absorption caused by plastic deformation. Furthermore, in the case the controller 31 has judged the impact speed to be lower than a predetermined speed, the controller 31 may also be made to not apply a voltage to all the piezoelectric element actuators 25.

According to the chassis frame buckling control device 20 of the present embodiment as described above, when a load in the direction of elongation is generated in the piezoelectric element actuators 25 by the control of the controller 31, rigidity at the sections where the piezoelectric element actuators 25 are arranged on the front side frames 11 increases as a result of stretching by the piezoelectric element actuators 25, there is greater resistance to buckling even if the holes 22 are located nearby. Conversely, when a load in the direction of contraction is generated in the piezoelectric element actuators 25 or a load is not generated in the piezoelectric element actuators 25, rigidity at the sections where the piezoelectric element actuators 25 are arranged on the front side frames 11 decreases, thereby making it possible to promote buckling from the holes 22 provided nearby. Thus, the front side frames 11 can be made to reliably buckle properly at all times with respect to a plurality of different types of impacts, such as types of impacts in which it is preferable for them to resist buckling or types of impacts in which it is preferable for buckling to be promoted.

Figure 5:
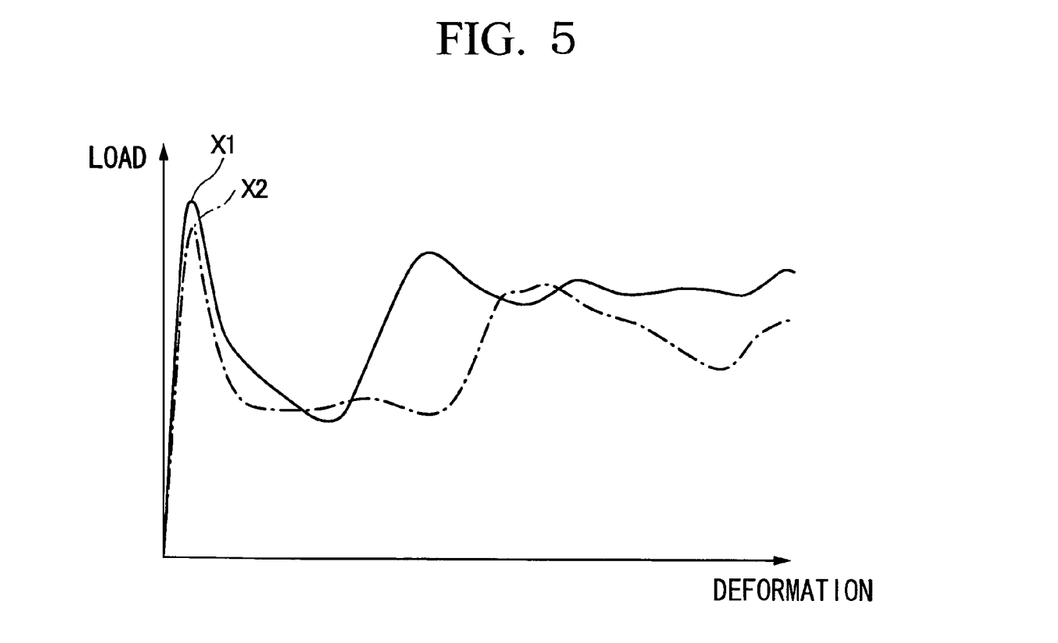
FIG. 5 is a compressive load vs. deformation curve of a front side frame to which a chassis frame buckling control device of the first embodiment of the present invention is applied.

This is verified by the compressive load vs. deformation curve of FIG. 5 in which the buckling starting load X1 in the case a load has been generated in the direction of elongation in the piezoelectric element actuators 25 (continuous line) is greater than the buckling starting load X2 in the case a load has been generated in the direction of contraction in the piezoelectric element actuators 25 (chain line).

Furthermore, the aforementioned piezoelectric element actuators can also be provided not only on the front ends of the front side frames 11, but also at other preferable locations of the chassis frame, such as the rear ends in the longitudinal direction of the chassis, namely the distal ends of rear frames provided along the chassis longitudinal direction in the rear of the chassis.

Second Embodiment

The following provides an explanation of a chassis frame deformation control device of a second embodiment of the present invention with reference to the drawings.

Figure 6:
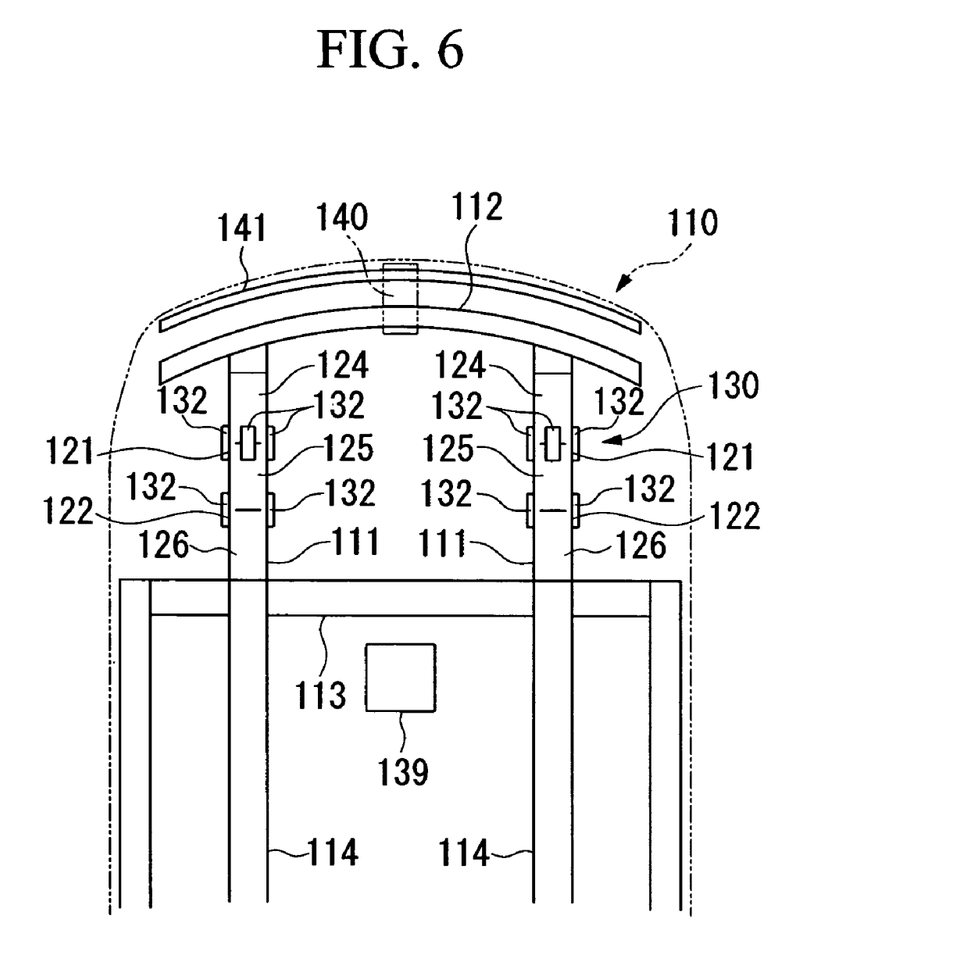
FIG. 6 is an overhead view schematically showing the front section of a vehicle frame to which a chassis frame deformation control device of a second embodiment of the present invention is applied.

FIG. 6 shows the front section of a chassis of a vehicle 110. In the front section of the chassis, a pair of front side frames (chassis frames) 111, which are chassis frame members, are provided separated in the direction of vehicle width in the state of running in the longitudinal direction of the chassis. The distal ends of the front side frames 111 are respectively coupled to a front bumper beam 112 that extends in the direction of vehicle width. The proximal ends of the front side frames 111 respectively intersect with a dashboard lower cross member 113 extending in the direction of vehicle width, and are coupled to floor frames 114 that extend in the longitudinal direction of the chassis.

Figure 7:
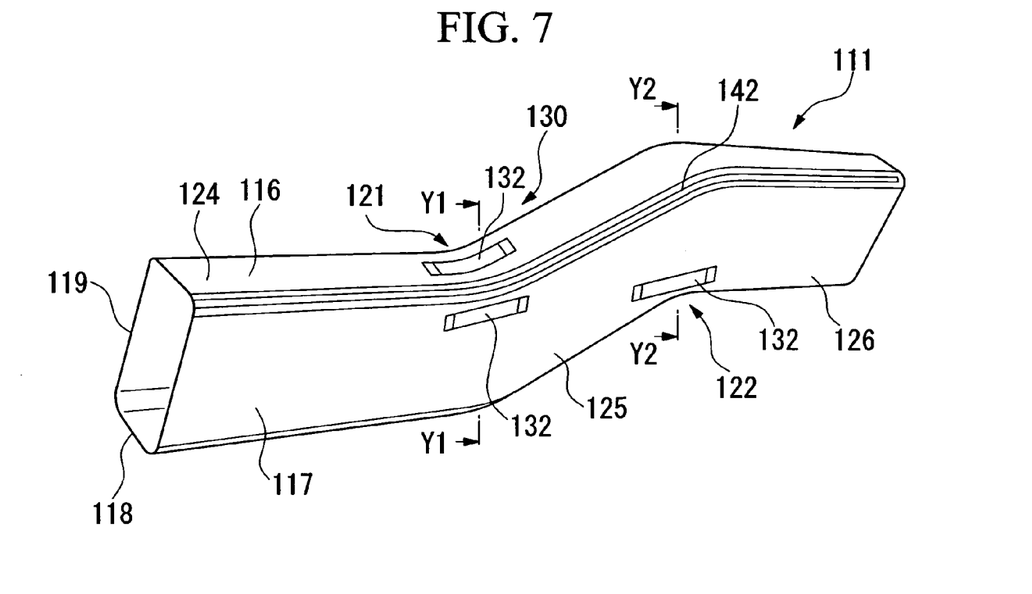
FIG. 7 is a perspective view showing a front-side frame to which a chassis frame deformation control device of the second embodiment of the present invention is applied.
Figure 8A:
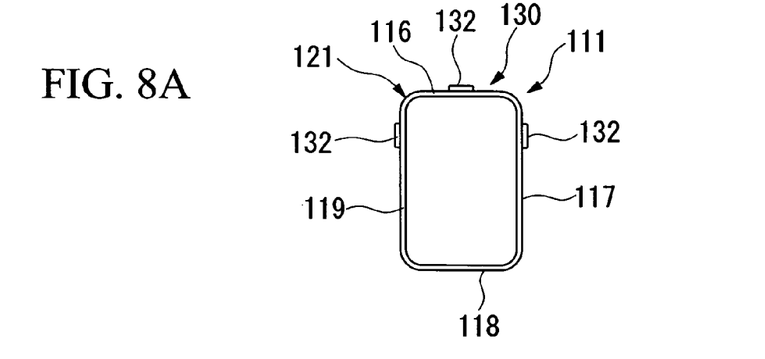
FIG. 8A and FIG. 8B are cross-sectional views of a front side frame to which a chassis frame deformation control device of the second embodiment of the present invention is applied, with FIG. 8A being a cross-sectional view taken along line Y1—Y1 in FIG. 7, and FIG. 8B being a cross-sectional view taken along line Y2—Y2 in FIG. 7.
Figure 8B:
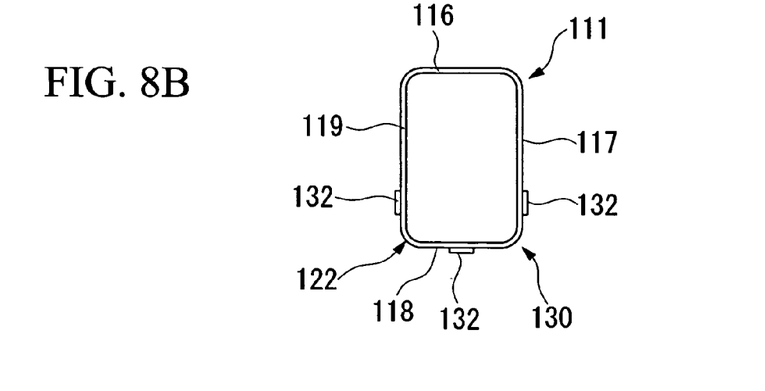

The front side frames 111 are made of a steel material, and as schematically shown in FIG. 7, FIG. 8A and FIG. 8B, four plate sections 116 through 119 are coupled in the shape of a frame, and the cross-sections that are perpendicular to the direction of length are in the form of a nearly rectangular, closed cross-sections.

In addition, distal bent sections (bent sections) 121, which are bent to form an obtuse angle on one side, are formed on the distal ends at intermediate locations of the front side frames 111. Proximal bent sections (bent sections) 122, which are bent to form an obtuse angle on the opposite side, are formed on the side more proximal than the distal bent sections 121 at intermediate locations. As a result, the front side frames 111 are composed of distal frame sections 124 located farther towards the distal side than the distal bent sections 121, intermediate frame sections 125 located between the distal bent sections 121 and the proximal bent sections 122, and proximal frame sections 126 located farther towards the proximal side than the proximal bent sections 122. The distal frame sections 124 and the proximal frame sections 126 are in parallel.

A chassis frame deformation control device 130 of the present embodiment controls deformation of the front side frames 111 during an impact.

In the chassis frame deformation control device 130 of the present embodiment, a plurality of piezoelectric element actuators 132, which are capable of generating a load in the direction of extension of the front side frames 111, are provided on the inside corner of the distal bent section 121 of each front side frame 111. A plurality of the piezoelectric element actuators 132, which are capable of generating a load in the direction of extension of the front side frames 111, are also provided on the inside corner of the proximal bent section 122 of each front side frame 111.

Specifically, in the distal bent section 121, a total of three piezoelectric element actuators 132 are provided, one on the plate section 116 of the inside corner and on the inside corners of the plate sections 117, 119 which are adjacent to the both side of the plate section 116. Each piezoelectric element actuator 132 has a rectangular shape. The piezoelectric element actuator 132 provided on the plate section 116 in the distal bent section 121 is arranged longitudinally across the center of the bend in the plate section 116 in the direction of extension of the front side frame 111. In addition, the piezoelectric element actuator 132 provided on the plate section 117 in the distal bent section 121 is arranged longitudinally across a bisector of the bend in the plate section 117 in the direction of extension of the front side frame 111. The piezoelectric element actuator 132 provided on the plate section 119 in the distal bent section 121 is also longitudinally arranged across a bisector of the bend in the plate section 119 in the direction of extension of the front side frame 111.

In addition, in the proximal bent section 122, a total of three piezoelectric element actuators 132 are provided, one on the plate section 118 of the inside corner and on the inside corners of the plate sections 117, 119 which are adjacent to the both side of a plate section 118. The piezoelectric element actuator 132 provided on the plate section 118 in the proximal bent section 122 is arranged longitudinally across the center of the bend in the plate section 118 in the direction of extension of the front side frame 111. In addition, the piezoelectric element actuator 132 provided on the plate section 117 in the proximal bent section 122 is arranged longitudinally across a bisector of the bend in the plate section 117 in the direction of extension of the front side frame 111. The piezoelectric element actuator 132 provided on the plate section 119 in the proximal bent section 122 is also longitudinally arranged across a bisector of the bend in the plate section 119 in the direction of extension of the front side frame 111.

Figure 9A:
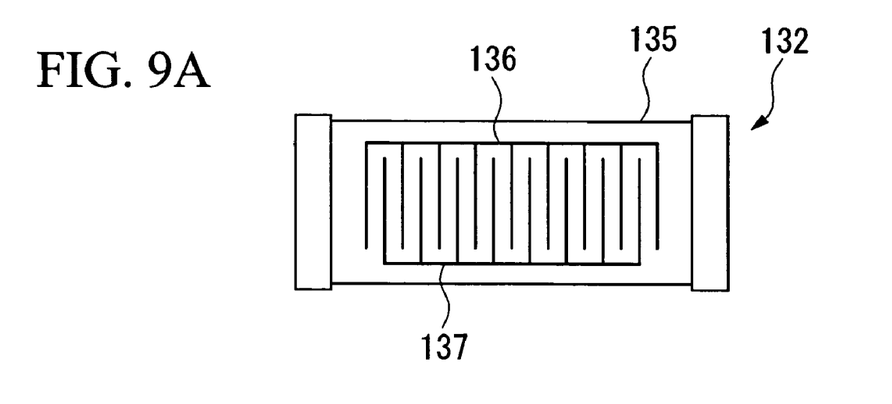
FIG. 9A and FIG. 9B are drawings showing a piezoelectric element actuator in a chassis frame deformation control device of the second embodiment of the present invention, with FIG. 9A being an overhead view and FIG. 9B being a perspective view.
Figure 9B:
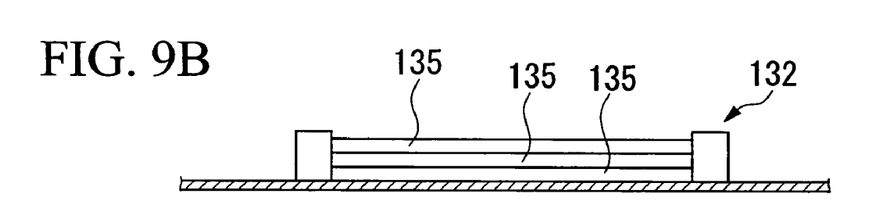

As shown in FIG. 9, each piezoelectric element actuator 132 is composed of a plurality of piezoelectric elements 135 having the same shape being laminated in the direction of thickness while aligning their orientation. Each piezoelectric element 135 is provided with an electrode 136 and an electrode 137 that are mutually intermeshing each in the shape of a comb. When voltage is applied using the electrode 136 as a positive electrode and the other electrode 137 as a negative electrode, each piezoelectric element 135 generates a load in the direction of elongation in the lengthwise direction. Conversely, when a voltage is applied using the electrode 136 as a negative electrode and the other electrode 137 as a positive electrode, each piezoelectric element 135 generates a load in the direction of contraction in the lengthwise direction.

All of these piezoelectric element actuators 132 are connected to a controller (control unit) 139 shown in FIG. 6. The controller 139 controls the voltage applied to electrodes 136, 137, namely the loads of the piezoelectric element actuators 132. The controller 139 is connected to a radar 140, which detects an obstacle in front of the chassis, and a piezoelectric film sensor 141, which detects the type and intensity of an impact during the initial start of an impact, for example.

As shown in FIG. 7, the front side frame 111 is provided with a sensor (detection unit) 142 capable of detecting the location where buckling progresses along the direction of extension from the distal side to the proximal side. Although not shown in the drawing, this sensor 142 is composed of the sensor elements, for example, such as a large number of piezoelectric elements or strain gauges arranged in series in the direction of extension of the front side frame 111. The controller 139 judges that buckling has progressed to the location where deformation has been detected by the sensor elements in this sensor 142. The sensor 142 is provided on the front side frame 111 so as to pass through the inside corner of distal bent section 121. The controller 139 then controls the loads of the piezoelectric element actuators 132 based on the detection results of this sensor 142.

Specifically, the controller 139 predicts the possibility of an impact with a forward obstacle based on detection data of the radar 140, and judges the type and intensity of the impact during the initial start of the impact according to the piezoelectric film sensor 141. In the case, for example, the type of impact has been judged to be a flat barrier impact, the controller 139 applies a voltage to all the piezoelectric element actuators 132 provided on distal bent sections 121 and to all the piezoelectric element actuators 132 provided on the proximal bent sections 122 so as to generate a load in the direction of elongation. Whereupon, even if the load of the impact is input from the distal side of the distal frame sections 124, as a result of stretching by the piezoelectric element actuators 132 on the inside corners of distal bent sections 121 and stretching by the piezoelectric element actuators 132 on the inside corners of the proximal bent sections 122, breakage of the front side frames 111 occurring from these distal bent sections 121 and the proximal bent sections 122 is inhibited. As a result, the front side frames 111 collapses and buckles from the distal sides of the distal frame sections 124 without breakage as shown in FIG. 10 part (a) through part (b).

The controller 139 holds the location where buckling progresses from the detection results of the sensor 142. As shown in FIG. 10 part (b), when the location where buckling progresses is detected to have reached distal bent section 121, the controller 139 interrupts the application of voltage to all the piezoelectric element actuators 132 of distal bent section 121 while continuing to apply voltage to all the piezoelectric element actuators 132 of the proximal bent section 122. Whereupon, the buckling of the intermediate frame section 125 progresses from the distal side satisfactorily as shown in FIG. 10 part (b) through part (c).

Figure 10:
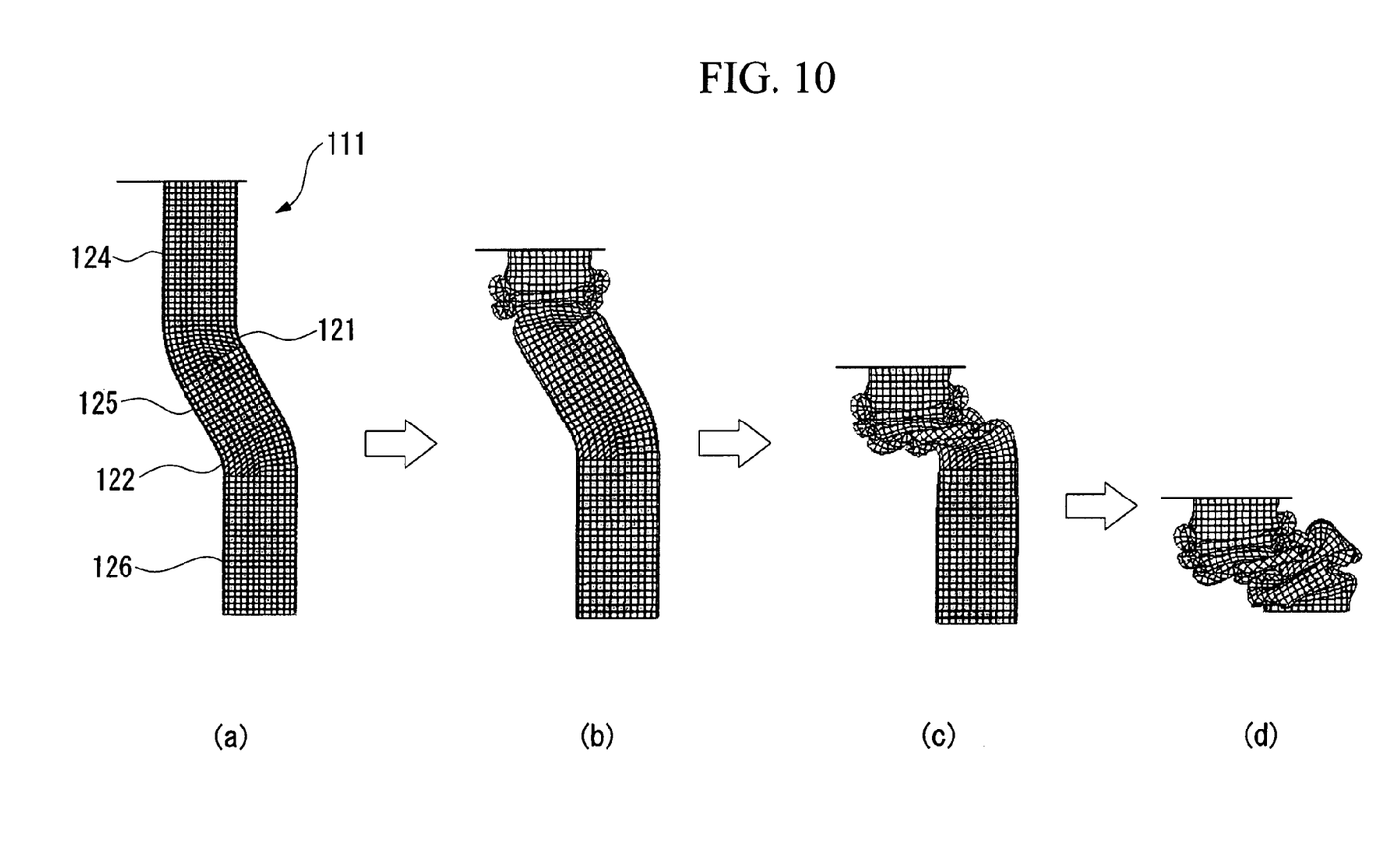
FIG. 10 is a schematic drawing showing the progression of deformation in a collapse buckling mode of a front side frame to which a chassis frame deformation control device of the second embodiment of the present invention is applied.

Continuing, when the location where buckling progresses is detected to have reached the proximal bent section 122 based on the detection results of the sensor 142 as shown in FIG. 10 part (c), the controller 139 interrupts the application of voltage to all the piezoelectric element actuators 132 of the proximal bent section 122. Whereupon, the buckling of the proximal frame section 126 progresses from the distal side satisfactorily as shown in FIG. 10 part (c) through part (d).

As a result of the controller 139 controlling the piezoelectric element actuators 132 in this manner, breakage of the front side frames 111 from distal bent sections 121 and the proximal bent sections 122 can be prevented, thereby enabling the front side frames 111 to be deformed in a collapse buckling mode and improving the efficiency of energy absorption.

Figure 11:
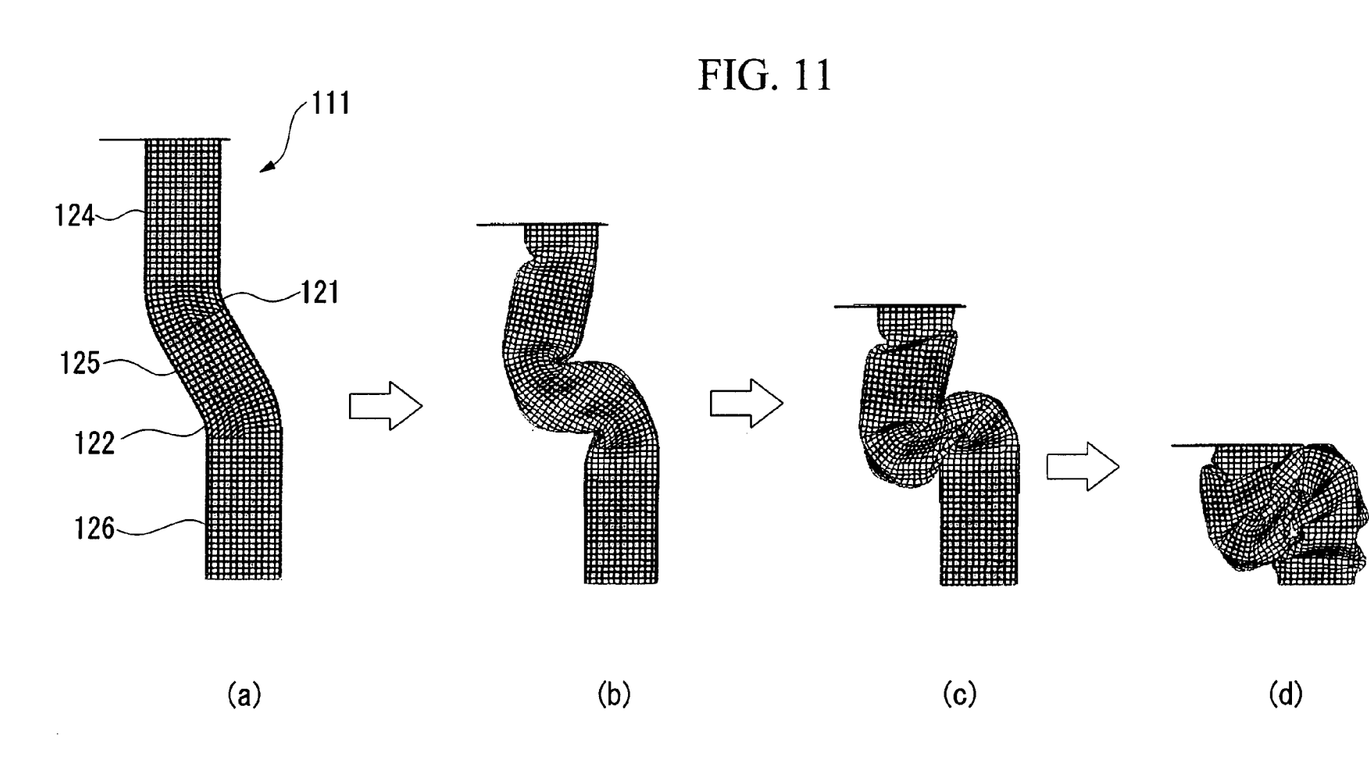
FIG. 11 is a schematic drawing showing the progression of deformation in a breaking mode of a front side frame to which a chassis frame deformation control device of the second embodiment of the present invention is applied.

On the other hand, for example, in the case the type of impact has been judged to be an offset impact, breakage of the impact-side frame is prevented as previously described and the controller 139 does not apply a voltage to all the piezoelectric element actuators 132 of distal bent sections 121 and the proximal bent sections 122 in the non-impact side frame so as not to generate a load. Whereupon, as shown in FIG. 11 part (a) and part (b), as a result of a impact load being input from the distal side of the distal frame section 124, breakage occurs in the front side frame 111 so as to decrease the respective inside angles of distal bent section 121 and the proximal bent section 122. As shown in FIG. 11 part (a) through FIG. 11 part (d), the front side frame 111 is able to be deformed in a Z-shaped breaking mode, thereby making it possible to absorb energy as a result of the non-impact side frame also breaking during an offset impact.

Figure 12:
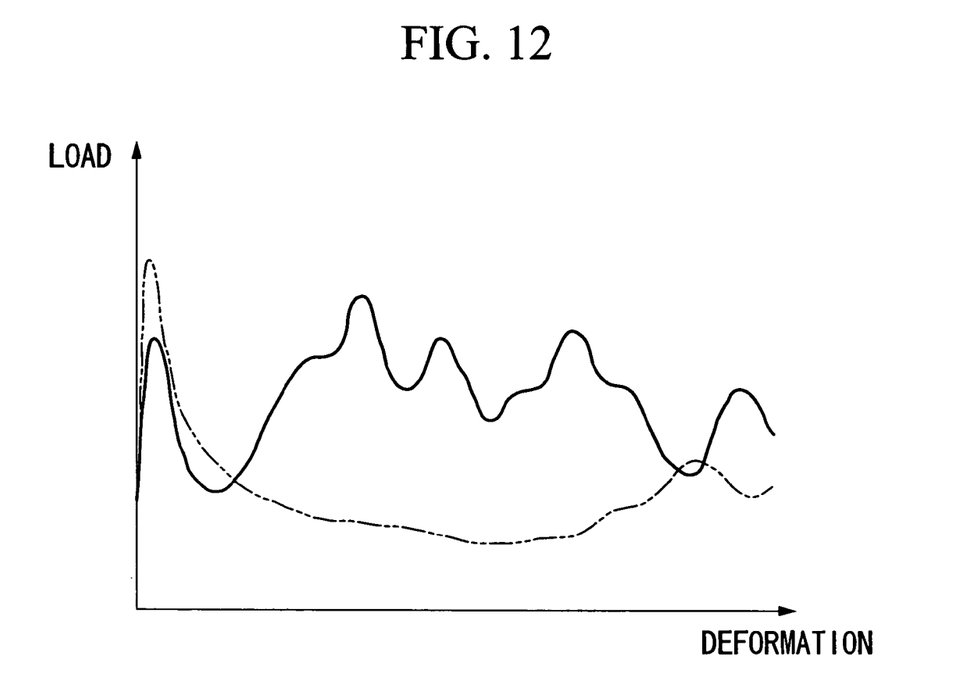
FIG. 12 is a compressive load vs. deformation curve of a front side frame to which a chassis frame deformation control device of the second embodiment of the present invention is applied.

Here, as shown in the compressive load vs. deformation curve of FIG. 12, in the case the front side frames 111 are deformed in the previously described collapse buckling mode (continuous line), a large, stable load can be generated over the entire range of deformation, while in the case of deformation in the breaking mode (chain line), the load can be increased during initial deformation.

According to the chassis frame deformation control device 130 of the present embodiment as described above, as a result of the piezoelectric element actuators 132 stretching when a load in the direction of elongation is generated in the piezoelectric element actuators 132 by the control of the controller 139, the rigidity of the front side frames 111 can be increased at those sections where the piezoelectric element actuators 132 are arranged. Conversely, the rigidity of the front side frames 111 can be decreased at those sections where the piezoelectric element actuators 132 are arranged if a load is not generated in the piezoelectric element actuators 132. Accordingly, the front side frames 111 can be made to properly deform at all times for a plurality of different types of impacts by providing the piezoelectric element actuators 132 at suitable locations. In other words, if the piezoelectric element actuators 132 are arranged on the inside corners of distal bent sections 121 and the proximal bent sections 122 of the front side frames 111 and loads in the direction of elongation are generated in these piezoelectric element actuators 132 during a impact, the front side frames 111 can be collapsed and buckled while inhibiting the occurrence of breakage in distal bent sections 121 and the proximal bent sections 122. Conversely, breakage can be caused to occur in distal bent sections 121 and the proximal bent sections 122 if loads are not generated in these piezoelectric element actuators 132 during an impact. Thus, the front side frames 111 can be made to properly deform reliably at all times for a plurality of different types of impacts, such as types of impacts in which the occurrence of buckling is preferable or those in which it is preferable to cause breakage. Furthermore, loads in the direction of contraction may also be generated in the piezoelectric element actuators 132 in the case of causing breakage in distal bent sections 121 and the proximal bent sections 122 during an impact.

Moreover, since the locations in the front side frames 111 where buckling progresses can be detected with the sensor 142, and the generation of loads in the piezoelectric element actuators 132 can be controlled corresponding to those detection results, namely corresponding to the location where buckling progresses, deformation of the front side frames 111 can be controlled more precisely. In other words, by arranging the piezoelectric element actuators 132 on the inside corners of distal bent sections 121 and inside corners of the proximal bent sections 122 of the front side frames 111, causing the piezoelectric element actuators 132 to stretch by generating a load in the direction of elongation in the piezoelectric element actuators 132 of distal bent sections 121 and the proximal bent sections 122 during a impact so as to cause buckling to distal bent sections 121, and then interrupting the loads of the piezoelectric element actuators 132 of distal bent sections 121 to stop them from stretching when the buckling reaches distal bent sections 121, buckling can be made to occur farther towards the rear from distal bent sections 121. Continuing, by interrupting the loads of the piezoelectric element actuators 132 of distal bent sections 122 to stop them stretching when the buckling reaches distal bent sections 122, buckling can be made to occur farther towards the rear from the proximal bent sections 122. Therefore, the front side frames 111 can be made to collapse and buckle reliably in a collapse buckling mode even if distal bent sections 121 and the proximal bent sections 122 are present.

In addition, since breakage of the front side frames 111 can be prevented without providing stiffeners and so forth, the weight of the vehicle body can be reduced.

Furthermore, the piezoelectric element actuators 132 may be driven so that the front side frames 111 are always deformed in the collapse buckling mode at all the time during the occurrence of an impact.

In addition, the present embodiment may be applied not only to the front side frames 111, but also to other chassis frames such as rear frames that run in the longitudinal direction in the rear of the chassis.

While preferred embodiments of the invention have been described and illustrated above, it should be understood that these are exemplary of the invention and are not to be considered as limiting. Additions, omissions, substitutions and other modifications can be made without departing from the spirit or scope of the present invention. The invention is not to be considered as being limited by the foregoing description, and is only limited by the scope of the appended claims.

What is claimed is:

1. A buckling control device for a chassis frame in the form of a front side frame having a rectangular shape having corner sections, comprising:
    a sensor operational to detect a possibility of an impact with an obstacle and an impact speed;
    a hole formed at at least one of the corner sections;
    rectangular piezoelectric element actuators which can extend and contract along a longitudinal direction of the front side frame, and which are provided on the front side frame at surfaces that define the corner section having the hole, the actuators are longer than the hole and are positioned beside the hole and extend in the longitudinal direction; and,
    a control unit that controls load applied by the actuators, wherein
    the piezoelectric element actuators are operational to apply loads onto the chassis frame along the longitudinal direction thereof, and wherein
    based on a detection by the sensor, the control unit controls the piezoelectric element actuators so as to extend when the impact speed is predicted to be faster than a predetermined speed, while the control unit controls the piezoelectric element actuators so as to contract when the impact speed is predicted to be slower than a predetermined speed.

2. The buckling control device according to claim 1, further comprising a hole formed at each of the corner sections, and rectangular piezoelectric element actuators which can extend and contract along a longitudinal direction of the front side frame, and which are provided on the front side frame at surfaces that define each of the corner sections having a hole, the actuators are longer than each hole and are positioned beside the respective holes and extend in the longitudinal direction.

3. The buckling control device according to claim 1, wherein
    each of the piezoelectric element actuators comprises a plurality of piezoelectric elements of the same shape being layered in a direction of thickness and having aligned orientations, and
    each of the piezoelectric elements includes electrodes having a comb-like shape aligned reciprocally.

* * * * *